(12) United States Patent
Yamazaki et al.

(10) Patent No.: US 8,737,115 B2
(45) Date of Patent: May 27, 2014

(54) METHOD OF FORMING PROCESS FOR VARIABLE RESISTIVE ELEMENT AND NON-VOLATILE SEMICONDUCTOR MEMORY DEVICE

(75) Inventors: Shinobu Yamazaki, Osaka (JP); Kazuya Ishihara, Osaka (JP); Suguru Kawabata, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 59 days.

(21) Appl. No.: 13/478,498

(22) Filed: May 23, 2012

(65) Prior Publication Data

US 2012/0300532 A1    Nov. 29, 2012

(30) Foreign Application Priority Data

May 24, 2011  (JP) ................................. 2011-115559

(51) Int. Cl.
*G11C 13/00* (2006.01)
*G11C 11/16* (2006.01)

(52) U.S. Cl.
CPC ............ *G11C 13/0069* (2013.01); *G11C 11/16* (2013.01)
USPC .......................................... 365/148; 365/158

(58) Field of Classification Search
CPC ............................. G11C 11/16; G11C 13/0069
USPC .................................................. 365/148, 158
See application file for complete search history.

(56) References Cited

U.S. PATENT DOCUMENTS 8,125,817 B2 *  2/2012  Takagi et al. ................. 365/148
2011/0235401 A1  9/2011  Kunitake et al.

FOREIGN PATENT DOCUMENTS

JP  2011-9344    1/2011
JP  2011-198430  10/2011

OTHER PUBLICATIONS

Tsunoda et al., "Low Power and High Speed Switching of Ti-doped NiO ReRAM under the Unipolar Voltage Source of less than 3 V", IEDM Technical Digest., (2007), pp. 767-770.
Lee et al., "Low Power and High Speed Bipolar Switching with a Thin Reactive Ti Buffer Layer in Robust HfO$_2$ Based RRAM", IEDM Technical Digest, (2008), pp. 297-300.

* cited by examiner

*Primary Examiner* — Michael Tran
(74) *Attorney, Agent, or Firm* — Nixon & Vanderhye, P.C.

(57) ABSTRACT

A method of a forming process for a variable resistive element, which is performed in short time comparable to the pulse forming and a writing current in a switching action is the same level as that of the DC forming, is provided. In the forming process, a variable resistive element is changed by voltage pulse application from an initial high resistance state just after produced to a variable resistance state where the switching action is performed. The forming process includes a first step of applying a first pulse having a voltage amplitude lower than a threshold voltage at which the resistance of the variable resistive element is lowered, to between both electrodes of the variable resistive element, and a second step of applying a second pulse having a voltage amplitude having the same polarity as the first pulse and not lower than the threshold voltage, thereto after the first step.

13 Claims, 14 Drawing Sheets

METHOD OF FORMING PROCESS FOR VARIABLE RESISTIVE ELEMENT AND NON-VOLATILE SEMICONDUCTOR MEMORY DEVICE

CROSS REFERENCE TO RELATED APPLICATION

This Nonprovisional application claims priority under 35 U.S.C. §119(a) on Patent Application No. 2011-115559 filed in Japan on May 24, 2011 the entire contents of which are hereby incorporated by reference.

BACKGROUND OF THE INVENTION

1. Field of the Invention

The present invention relates to a non-volatile semiconductor memory device using a variable resistive element and a method for driving the same, and more particularly to a method of a forming process for a variable resistive element, as an initializing process.

2. Description of the Related Art

Recently, new type non-volatile semiconductor memory devices have been widely studied as an alternative to a flash memory. Among them, a RRAM (Resistance Random Access Memory) uses a phenomenon in which resistance is changed by applying a voltage to a variable resistor formed of a transition metal oxide and has an advantage in a view of a miniaturization limit compared to the flash memory, and its research and development has been actively undertaken because data can be written at high speed.

The variable resistive element used in the RRAM as the new memory has a structure in which a lower electrode (first electrode), a variable resistor, and an upper electrode (second electrode) are laminated in this order, and has properties in which its resistance value can be reversibly changed by applying an electric stress such as a voltage pulse to between the upper electrode and the lower electrode. The RRAM is the new memory realized by reading the resistance value changed due to this reversible resistance changing action (hereinafter, referred to as the "switching action" occasionally).

As a material of the variable resistor, it is known that the switching action is generated in various kinds of metal oxides. Especially, the phenomenon of the switching action is reported in detail in "Low Power and High Speed Switching of Ti-doped NiO ReRAM under the Unipolar Voltage Source of less than 3 V", IEDM Technical Digest. 2007, p. 767-770 (hereinafter, referred to as the "publicly known document 1") by K. Tsunoda et al, as for a nickel oxide (NiO) film, and in "Low Power and High Speed Bipolar Switching with A Thin Reactive Ti Buffer Layer in Robust HfO2 Based RRAM", IEDM Technical Digest. 2008, p. 297-300 (hereinafter, referred to as the "publicly known document 2") by H.Y. Lee et al. as for a hafnium oxide (HfO2) film.

However, as for the variable resistive element using the transition metal oxide as the variable resistor, as reported in the publicly known documents 1 and 2, there is a problem that just after the structure in which the variable resistor material is sandwiched between the upper and lower electrodes is produced, its resistance state is higher than a high resistance state provided in the switching action, and the resistance state is not changed. That is, it is known that in order to lower the resistance of the variable resistive element and change the variable resistive element into a state in which the switching action can be performed (variable resistance state), it is necessary to perform a step (hereinafter, referred to as the "forming process" occasionally) of applying a specific electric stimulus to between the upper and lower electrodes.

In other words, the variable resistive element using the metal oxide as the variable resistor is in an insulating state as an initial state just after produced, so that in order to change the variable resistive element into a state in which the resistance state can be switched between a high resistance state and a low resistance state by an electric stress, it is necessary to form a region (hereinafter, referred to as the "filament path" occasionally) in which a resistance rate is locally lowered in the oxide by applying a voltage to this, as shown in the publicly known documents 1 and 2. It is considered that the resistance state is switched because the filament path is formed or cut.

According to the publicly known documents 1 and 2, DC sweep is used in performing the forming process for the variable resistive element (hereinafter, referred to as the "DC forming process"). That is, the resistance of the variable resistive element is lowered while a voltage applied to the variable resistive element is gradually raised to a predetermined voltage to perform the forming process. Therefore, it is likely that it takes a very long time. Since it is expected that hundreds of M to several G-bit memory cells are mounted in an actual RRAM, it needs an extremely long time to perform the forming process. Since the method of the DC forming process is not a realistic way, it is assumed that the forming process is performed by applying a rectangular voltage pulse of several tens of ns to several hundreds of us in general (hereinafter, referred to as the "pulse forming process").

The inventors of the present invention have closely studied the switching action of the variable resistive element, using the pulse forming process. As a result, it has been found that a writing current required to realize the stable switching action differs between the DC forming process and the pulse forming process, and the several-fold writing current is needed in the pulse forming process.

Various factors are considered for this reason, but it is estimated that an electric property or structural property of the filament path formed by the forming process differs between the DC forming process and the pulse forming process.

A large writing current causes various kinds of disadvantages. For example, in order to implement the normal switching action, a selection transistor having a high current driving ability is needed, and the selection transistor becomes large in size, so that the memory cell becomes large, and it is extremely difficult to implement a large-capacity memory. Thus, this is not suitable for dealing with large data such as a movie file which is expected to be increasingly demanded in the future.

Furthermore, when the writing current needed is large, a surrounding circuit such as a writing voltage application circuit becomes large, and accordingly a chip size becomes large, so that it is difficult to provide a non-volatile memory at low cost. In addition, power consumption increases as a matter of course, so that it is considerably difficult to be mounted on a mobile device such as a mobile terminal which requires low power consumption.

SUMMARY OF THE INVENTION

The present invention was made in view of the above circumstances, and it is an object of the present invention to provide a method of a forming process performed prior to a switching action of a variable resistive element having a variable resistor formed of a metal oxide, in which a voltage is applied in an extremely short time comparable to the pulse forming process, and a writing current at the time of the switching action is suppressed to the same level as a writing current achieved by the DC forming process, and a non-volatile semiconductor memory device capable of implementing the method of the forming process, and stably performing the switching action at a small writing current.

An intensive study by the inventors of the present invention has invented a new forming method in which its forming time is short like the pulse forming process, and an action can be performed at a small writing current comparable to the DC forming process. The present invention is based on this knowledge. In addition, a detail of the method of the forming process will be described below in the description of the preferred embodiment.

According to a method of a forming process for a variable resistive element in the present invention to achieve the above object, with respect to the variable resistive element provided with a variable resistor formed of a metal oxide, and a first electrode and a second electrode sandwiching the variable resistor, the variable resistive element is changed to a variable resistance state in which a resistance state between the first and second electrodes of the variable resistive element is switched between two or more different resistance states by an applied voltage, the resistance state between the first and second electrodes of the variable resistive element is lowered by the forming process, the variable resistive element in the variable resistance state is allowed to hold the resistance state in a non-volatile manner, and the forming process includes a first step of applying a first pulse having a voltage amplitude set to be lower than a threshold voltage at which the resistance of the variable resistive element is lowered, to between the first and second electrodes of the variable resistive element, and a second step of applying a second pulse having a voltage amplitude having the same polarity as that of the first pulse and set to be not lower than the threshold voltage, to between the first and second electrodes of the variable resistive element after the first step.

According to the method of the forming process for the variable resistive element in the present invention having the above characteristics, it is preferable that the application of the first pulse in the first step, and the application of the second pulse in the second step are continuously performed by connecting an end of the first pulse to a start of the second pulse.

According to the method of the forming process for the variable resistive element in the present invention having the above characteristics, it is preferable that the first pulse has a gradually increasing voltage amplitude.

According to the method of the forming process for the variable resistive element in the present invention having the above characteristics, it is preferable that the variable resistor is formed of a metal oxide showing n-type conductivity.

According to the method of the forming process for the variable resistive element in the present invention having the above characteristics, it is preferable that the variable resistor is formed of a metal oxide selected from Ti, Ta, Hf, and Zr.

According to the method of the forming process for the variable resistive element in the present invention having the above characteristics, it is preferable that a work function of the first electrode is 4.5 eV or less, and a work function of the second electrode is 4.5 eV or more.

A non-volatile semiconductor memory device in the present invention to attain the above object has a memory cell including a variable resistive element and a selection transistor, the variable resistive element is provided with a variable resistor formed of a metal oxide, and a first electrode and a second electrode sandwiching the variable resistor, the selection transistor is provided with a control terminal and a pair of input and output terminals, a resistance state between the first and second electrodes of the variable resistive element is lowered by a forming process, so that the variable resistive element is changed from an initial high resistance state before the forming process to a variable resistance state, the resistance state is switched between two or more resistance states by an electric stress applied to between the first and second electrodes of the variable resistive element in the variable resistance state, and one switched resistance state is used for storing information, one of the first electrode and the second electrode of the variable resistive element is connected to one end of the pair of the input and output terminals of the selection transistor to constitute the memory cell, and the device includes a memory cell array provided by arranging the memory cells in a shape of a matrix in row and column directions, a word line extending in the row direction for connecting the control terminals of the selection transistors of the memory cells arranged in the same row, a bit line extending in the column direction for connecting the other ones of the first electrodes and the second electrodes of the variable resistive elements of the memory cells arranged in the same column, a common line extending in the row or column direction for connecting the other ends of the pair of the input and output terminals of the selection transistors of the memory cells, a word line voltage application circuit for applying a voltage to the word line connected to the memory cell selected as a forming process target, a forming voltage application circuit for applying a voltage required for the forming process, across the memory cell selected as the forming process target, through the bit line and the common line connected to the selected memory cell, and a control circuit for controlling the forming voltage application circuit in such a manner that a first pulse set to be lower than a threshold voltage at which the resistance of the variable resistive element is lowered, is applied to between the first and second electrodes of the variable resistive element selected as the forming process target, and then continuously a second pulse having the same polarity as that of the first pulse and set to be not lower than the threshold voltage is applied to between the first and second electrodes of the variable resistive element.

According to the non-volatile semiconductor memory device in the present invention having the above characteristics, it is preferable that the forming voltage application circuit applies the second pulse to one variable resistive element, and simultaneously applies the first pulse to at least one other variable resistive element in which the forming process is not yet completed, among the variable resistive elements selected as the forming process target.

According to the non-volatile semiconductor memory device in the present invention having the above characteristics, it is preferable that the forming voltage application circuit applies the second pulse to one variable resistive element, and simultaneously applies the first pulse previously to all the other variable resistive elements in which the forming process is not yet completed, among the variable resistive elements selected as the forming process target.

According to the non-volatile semiconductor memory device in the present invention having the above characteristics, it is preferable that the first pulse has a gradually increasing voltage amplitude.

According to the non-volatile semiconductor memory device in the present invention having the above characteristics, it is preferable that the variable resistor is formed of a metal oxide showing n-type conductivity.

According to the non-volatile semiconductor memory device in the present invention having the above characteristics, it is preferable that the variable resistor is formed of a metal oxide selected from Ti, Ta, Hf, and Zr.

According to the non-volatile semiconductor memory device in the present invention having the above characteristics, it is preferable that a work function of the first electrode is 4.5 eV or less, and a work function of the second electrode is 4.5 eV or more.

According to the method of the forming process for the variable resistive element, and the non-volatile semiconductor memory device in the present invention having the above characteristics, the forming process includes the first step of applying the voltage within the range where the resistance of the variable resistive element is not lowered, and the second step of applying the voltage not lower than the voltage at which the resistance of the variable resistive element is lowered, after the first step, so that the writing current at the time of the switching action after the forming process can be as small as that of the DC forming process.

Thus, when the memory cell is provided with the variable resistive element which has been processed by the above forming process method, the memory cell can be small in size, and a large-capacity RRAM can be produced. In addition, the RRAM which acts with low power consumption can be produced. Furthermore, a surrounding circuit such as a writing voltage application circuit can be also small, so that the RRAM can be produced at low cost.

Thus, according to the non-volatile semiconductor memory device in the present invention having the above characteristics, since the device itself is configured to be able to perform the method of the forming process, a large-capacity RRAM which acts with low power consumption can be easily produced at low cost.

Therefore, according to the present invention, the method of the forming process is provided such that the voltage application time is very short like the pulse forming process, and the writing current at the time of the switching action is suppressed to the same level as the writing current achieved by the DC forming process, and thus, the non-volatile semiconductor memory device can be provided such that the switching action can be stably performed at the small writing current.

DESCRIPTION OF THE PREFERRED EMBODIMENT

Hereinafter, a detailed description will be given of one embodiment of a non-volatile semiconductor memory device according to the present invention (hereinafter, referred to as the "device of the present invention" occasionally), and a method of a forming process according to the present invention (hereinafter, referred to as the "method of the present invention" occasionally), with reference to the drawings.

First Embodiment

Figure 1A:
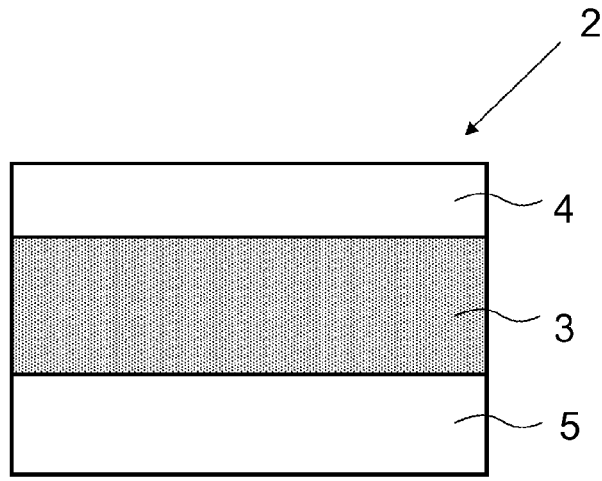
FIGS. 1A and 1B are views schematically showing basic configurations of variable resistive elements used in an embodiment of the present invention.
Figure 1B:
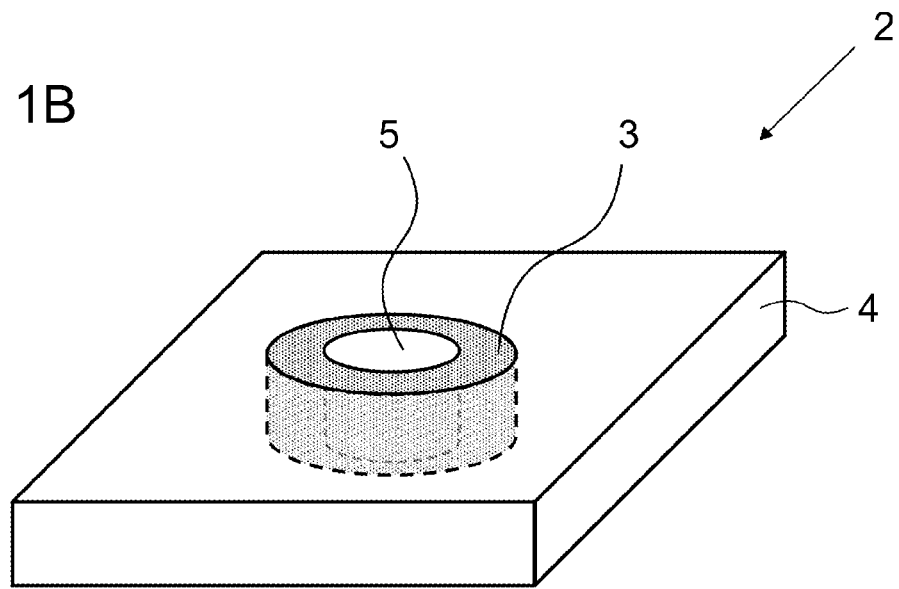

FIGS. 1A and 1B schematically show basic configuration examples of a variable resistive element 2 used in the device of the present invention and the method of the present invention. As shown in FIGS. 1A and 1B, the variable resistive element 2 is provided such that a variable resistor 3 including a metal oxide is sandwiched between a first electrode 4 and a second electrode 5.

Especially, FIG. 1A illustrates the element having the simplest planar type structure as a structure of the variable resistive element, but as for the variable resistive element which can be used in the present invention, the structure is not limited to the planar type structure, and as shown in FIG. 1B, the variable resistive element may include the plate electrode (first electrode) 4 having an opening, the columnar electrode (second electrode) 5 positioned in the center of the opening, and an annular variable resistor 3 sandwiched between the plate electrode 4 and the columnar electrode 5. That is, the element only has to have a two-terminal structure in which the variable resistor 3 is sandwiched between the two electrodes 4 and 5.

According to this embodiment, the two electrodes having different work functions (it is assumed that the first electrode has the smaller work function and the second electrode has the larger work function for descriptive purpose) are used, and the first electrode 4 serves as an upper electrode, and the second electrode 5 serves as a lower electrode, in the planar type structure shown in FIG. 1A. In addition, as the variable resistor 3, a metal oxide showing an n-type conductivity is used. The n-type metal oxide used for the variable resistor 3 includes a metal oxide selected from Ti, Ta, Hf, and Zr. According to this embodiment, a description will be given of the variable resistive element 2 using a hafnium oxide (HfOx) for the variable resistor 3.

When the n-type metal oxide is used for the variable resistor 3, the first electrode 4 is formed of a conductive material having the smaller work function to the extent that an ohmic junction is provided at an interface with the variable resistor 3, and the second electrode 5 is formed of a conductive material having the larger work function to the extent that non-ohmic junction (such as schottky junction) is provided at an interface with the variable resistor 3. A specific value of the work function is determined by a relationship with an electron trapping level generated due to an oxygen loss in the oxide of the variable resistor 3, but in the case of the n-type metal oxide, the work function of the first electrode 4 is preferably 4.5 eV or less, and the work function of the second electrode 5 is preferably 4.5 eV or more. As an electrode material which can be used in a semiconductor process among the metals which satisfy the above condition, Ti (4.2 eV), Hf (3.9 eV), Al (4.1 eV), or Ta (4.2 eV) is employed for the first electrode 4, and W (4.5 eV), Ni (5 eV), TiN (4.7 eV), WN (5 eV), NiSi (4.9 eV) or TaCxNy (4.4 to 4.8 eV) is employed for the second electrode 5. In addition, the number provided in parentheses behind the material shows the work function. According to this embodiment, as one example, a description will be given of the variable resistive element 2 in which the variable resistor 3 is formed of HfOx, the first electrode 4 is formed of Ti, and the second electrode 5 is formed of TiN.

As for the variable resistive element 2 having the variable resistor including the metal oxide, just after produced, the variable resistive element 2 is in an initial high resistance state higher than the range of resistance change in a switching action, so that the resistance change (switching action) is not generated even when a voltage is applied to between both electrodes 4 and 5 under a normal writing condition. Thus, by performing a forming process to initialize (to lower the resistance) the variable resistive element 2 to put it into a variable resistance state in which the switching action can be performed, a current path (filament path) in which a current (writing current) flows at the time of the switching action is formed in the variable resistor 3, so that the switching action can be performed. It is believed that once the filament path is formed, the resistance state is reversibly changed due to generation and elimination of the oxygen loss in the filament path caused by the voltage applied to between the electrodes 4 and 5.

Figure 2:
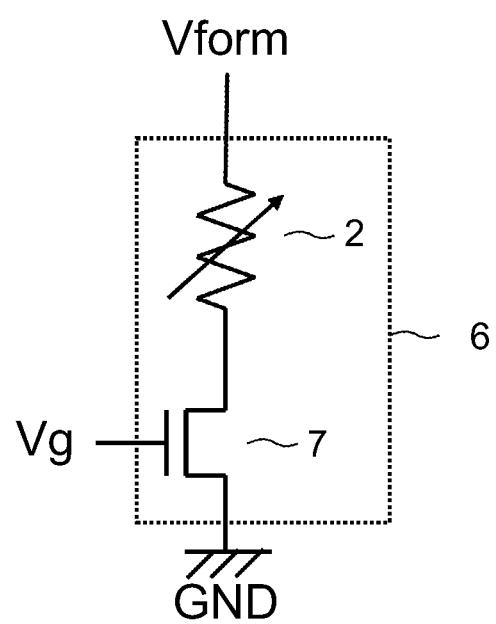
FIG. 2 is a circuit diagram to describe a specific example of a memory cell provided with the variable resistive element in the embodiment of the present invention, and a method of the forming process of the variable resistive element.

FIG. 2 shows a specific example of a circuit configuration of a memory cell 6 used in a description of the method of the present invention. As shown in FIG. 2, the memory cell 6 has a 1T1R structure in which the variable resistive element 2 shown in FIG. 1 and a transistor 7 are connected. The transistor 7 limits a current amount flowing to the variable resistive element 2 at the time of the forming process by controlling a gate voltage Vg.

Here, when the current amount flowing to the variable resistive element 2 is not limited, an excessive current flows in the variable resistive element 2 at the time of the forming process, and an appropriate filament path is not formed, so that the element is broken, and the switching phenomenon is not generated thereafter. Therefore, some kind of means for limiting the current amount is needed, but it is not limited to a method in which the transistor 7 is connected to the variable resistive element 2, and means for limiting the current amount may be provided on the side of a current source.

According to the forming process for the memory cell 6 shown in FIG. 2, under the condition that the gate voltage Vg is applied to a gate of the transistor 7, and a maximum value of the current amount flowing in the variable resistive element 2 is set to a predetermined limit value, a forming voltage Vform is applied from one end which is not connected to the transistor 7, of the variable resistive element 2.

Hereinafter, a description will be given of a result obtained by comparing a conventional DC forming process, a conventional pulse forming process, and the forming process performed for the variable resistive element 2 by the method of the present invention.

First, according to the DC forming process, the forming process is performed while the forming voltage Vform is gradually increased from 0 V to 5 V by 0.05 V over the course of a predetermined pulse application time under the condition that 1 V is applied as the Vg to the gate of the transistor 7. In this case, it takes several seconds to perform the DC forming process.

Figure 3:
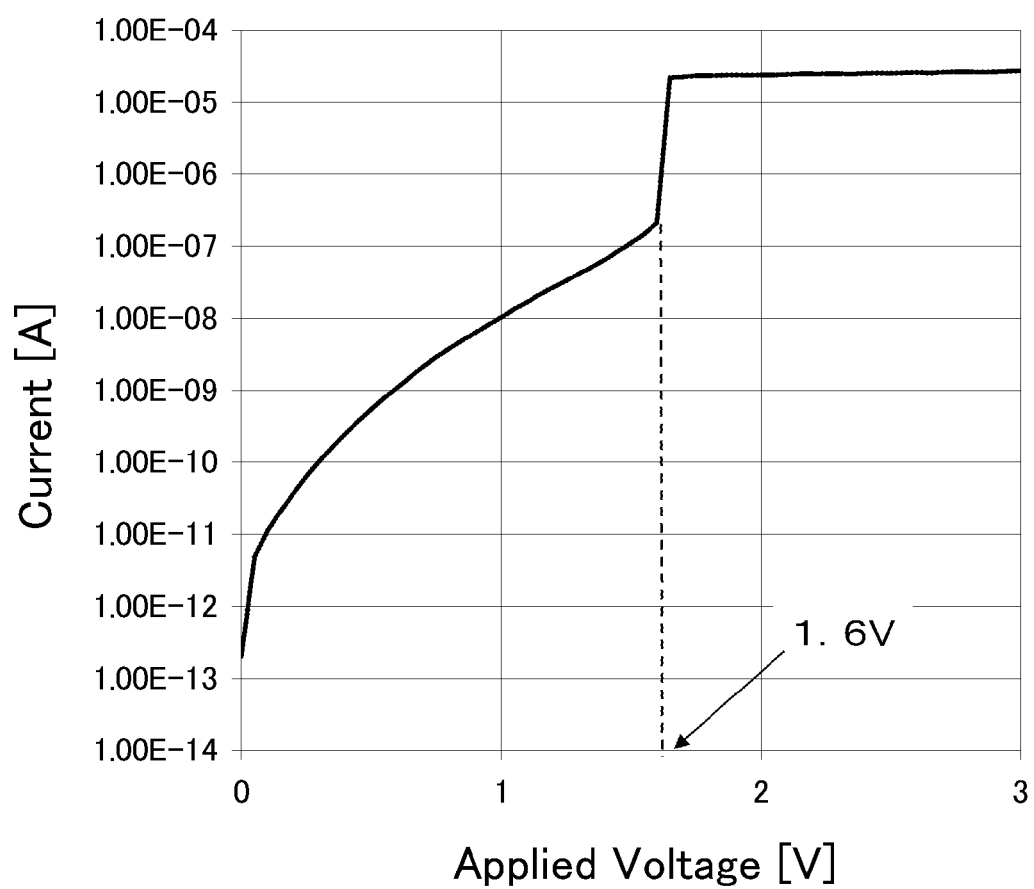
FIG. 3 is a view showing current voltage characteristics at the time of the forming process of the variable resistive element.

FIG. 3 shows one example of a current-voltage (I-V) curve at the time of the DC forming process. It can be found from FIG. 3 that the resistance of the variable resistive element 2 is lowered at about 1.6 V. That is, while the variable resistive element 2 holds insulation properties while the voltage is applied from 0 V to 1.6 V, but the insulation properties is destroyed due to the voltage application of 1.6 V, and the resistance is lowered, so that a current (a limit current value is about $3.00 \times 10^{-5}$ A=30 μA when Vg=1 V) limited by the voltage Vg applied to the gate of the transistor 7 flows under the condition that the voltage of 1.6 V or higher is applied.

Figure 4:
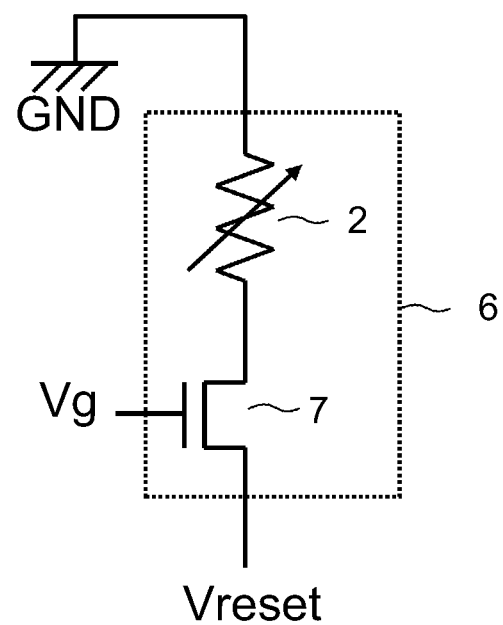
FIG. 4 is a circuit diagram to describe a method for applying a voltage in a reset action of the variable resistive element used in the embodiment of the present invention.

After this, an action to raise the resistance of the variable resistive element (hereinafter, referred to as the "reset action" occasionally) is performed. In the reset action, as shown in FIG. 4, a reset voltage Vreset is applied from one end which is not connected to the variable resistive element 2, of the transistor 7. At this time, as the reset voltage Vreset, a voltage pulse of 1.9 V and 20 ns in width is applied. In addition, 8 V is applied to the gate of the transistor 7. That is, in the reset action, the current is not limited by the transistor 7. However, as a result of measuring a current amount at the time of the reset action, a maximum current flowing at that time is about 100 μA.

Meanwhile, according the pulse forming process, as shown in FIG. 2, the forming process is performed by applying the forming voltage pulse Vform of 5V and 50 μs under the condition that 1 V is applied as the Vg to the gate of the transistor 7. Therefore, compared to the DC forming process, the forming process is performed in an extremely short time, that is, at extremely high speed. In this case also, the reset action is performed similarly to the DC forming process, and the reset current is measured, and it is found that a maximum current flowing at the time of the reset action is about 250 μA.

Figure 5:
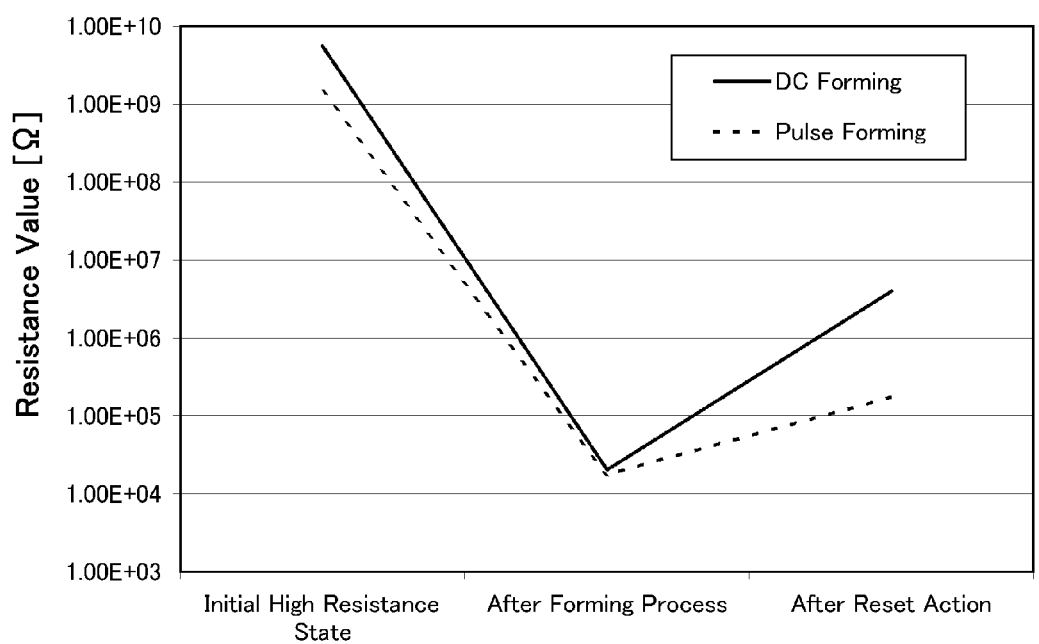
FIG. 5 is a view showing changes of resistance values in an initial high resistance state just after produced, a low resistance state after the forming process, and high resistance state after the reset action in a conventional DC forming process, and a conventional pulse forming process.

FIG. 5 shows changes of resistance values in the initial high resistance state just after produced, the low resistance state after the forming process, and the high resistance state after the reset action, in the case where the forming process is performed by the DC forming process, and in the case where the forming process is performed by the pulse forming process. It is found from FIG. 5 that the current flowing at the time of the reset action is smaller and a ratio of the resistance change of the variable resistive element is larger in the DC forming process than that in the pulse forming process even when the reset action is performed totally in the same way.

Therefore, it is found that the switching action is performed stably at a small current in the DC forming process. However, it takes several seconds to perform the DC forming process. Meanwhile, the forming process can be performed at high speed in the pulse forming process, but the reset current is large, and the resistance change ratio is smaller than the DC forming process.

Figure 6:
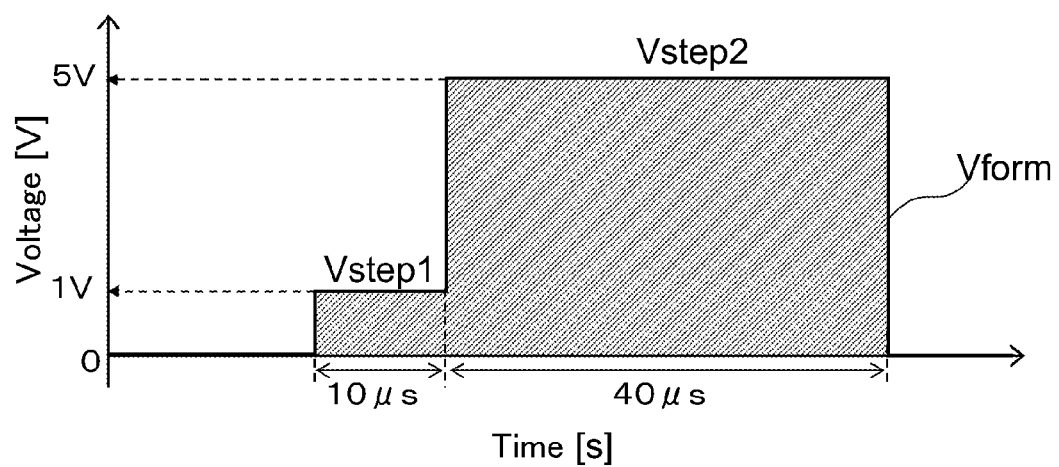
FIG. 6 is a view showing a voltage waveform of a forming voltage pulse applied to the variable resistive element selected as a forming process target, in the present invention.
Figure 7:
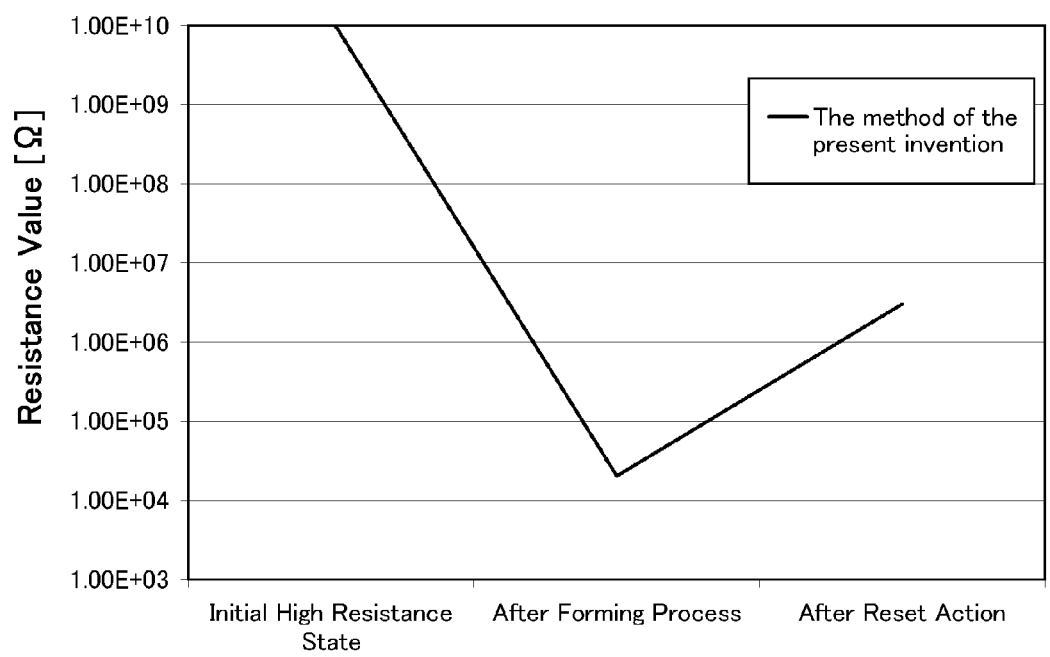
FIG. 7 is a view showing a change of resistance values in an initial high resistance state just after produced, a low resistance state after the forming process, and high resistance state after the reset action in the forming process according to the present invention.

Meanwhile, according to the forming process by the method of the present invention, the forming process is performed by applying the forming voltage pulse Vform having a waveform shown in FIG. 6. That is, in a first step, a first pulse having a voltage amplitude lower than 1.6 V (here, Vstep1=1.0 V) that does not lower the resistance is applied for the first 10 μs from the start of voltage application. Then, in a second step, a second pulse having a voltage amplitude of 1.6 V or higher (here, Vstep2=5.0 V) that lowers the resistance is applied from 10 μs to 50 μs. When the forming process is performed through the above steps, a maximum current flowing at the time of the reset action is about 100 μA, which is about the same as that of the DC forming process. In addition, as shown in FIG. 7, a ratio of the resistance change is about the same as that of the DC forming process.

Figure 8:
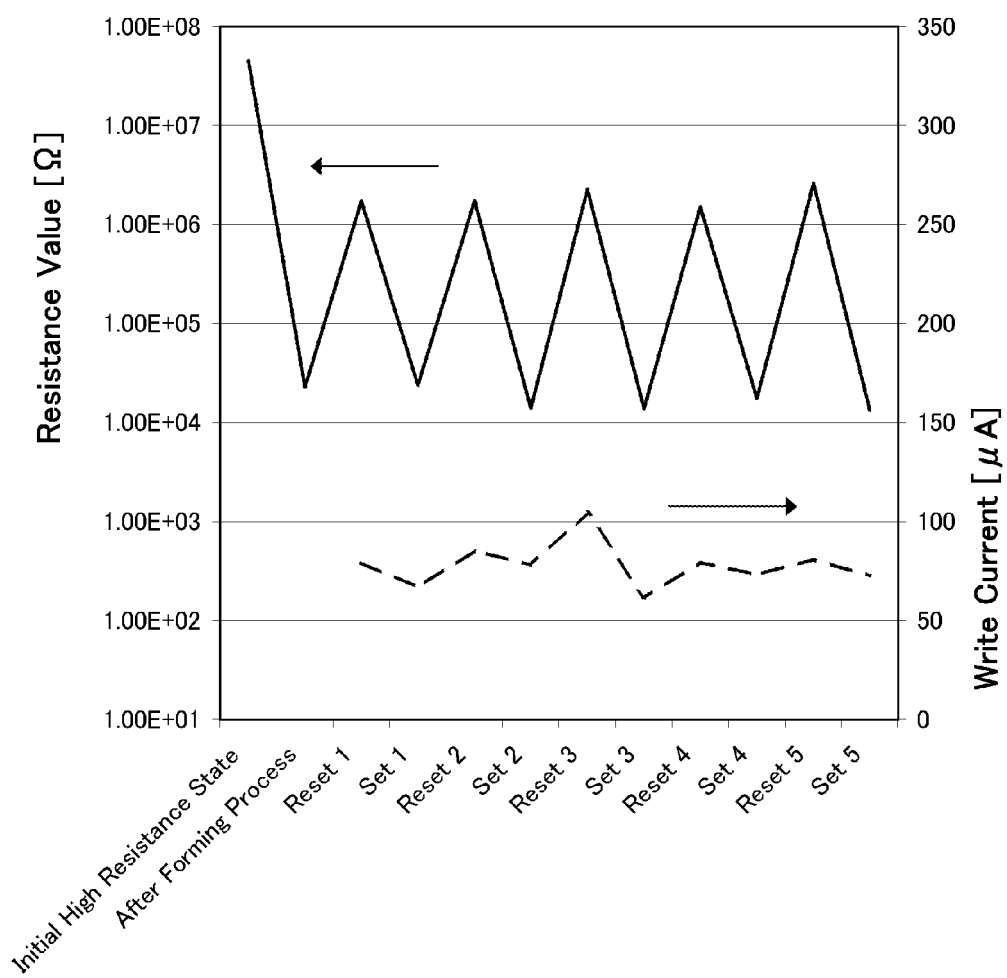
FIG. 8 is a view showing a change of resistance values and a change of writing currents when the reset action and a set action are repeated for the variable resistive element after the forming process of the present invention has been performed.

After the forming process and the reset action performed as described above, an action to further lower the resistance of the variable resistive element 2 continuously (hereinafter, referred to as the "set action" occasionally) is performed, and FIG. 8 shows a change of resistance values (shown by a solid line) while the reset action and the set action are sequentially performed five times, and a writing current (shown by a broken line) flowing at the time of the reset action and the set action. It is found that a resistance change ratio between the reset action and the set action is one digit or more, and the writing current flowing at the time of the reset action and at the time of the set action is about 100 μA or less.

Therefore, according to the method of the present invention, while the time required for the forming process is the same (50 μs in this embodiment) as that of the conventional pulse forming process, the current flowing in the following reset action is extremely reduced to the same level as that of the DC forming process. That is, it is found that the method of the present invention is an extremely effective method to ensure that the forming process is performed in a short time, and the writing current at the time of the switching action is small.

In addition, even in the case of the pulse forming process, the reason why the characteristics after the forming process is improved by the method of the present invention is still being elucidated, but the following points are considered.

(1) According to the DC forming process, since the forming process is performed by gradually increasing the voltage applied to the variable resistive element 2, a voltage difference between the voltage just before the forming process and the voltage at the time of the forming process is considerably small. Meanwhile, according to the pulse forming process, the voltage applied to the variable resistive element 2 abruptly rises from 0 V to the predetermined voltage in the extremely short time. It is considered that this difference causes a difference in characteristics in the generated filament. More specifically, according to the pulse forming process, a large electric field is abruptly applied to the variable resistor, and it is considered that the generated filament is damaged and its shape and quality are varied, which causes an increase in reset current and a decrease in resistance change ratio. According to the method of the present invention, since the first pulse is applied before the second pulse to reduce a gap between the DC forming and the pulse forming, the variable resistive element 2 after the forming process can show the stable switching action at the small current even when the forming voltage pulse is applied in short time.

(2) According to the DC forming process, since the voltage is gradually increased until the forming is caused, it is considered that the voltage lower than a threshold voltage at which the forming is caused is applied to the variable resistive element for a certain amount of time, which allows for the difference in the characteristics of the generated filament. According to the method of the present invention, this situation is substantially realized by applying the first pulse in the first step, so that even by the short-time forming voltage pulse application, the variable resistive element 2 after the forming process can show the stable switching action at the small current.

Figure 9:
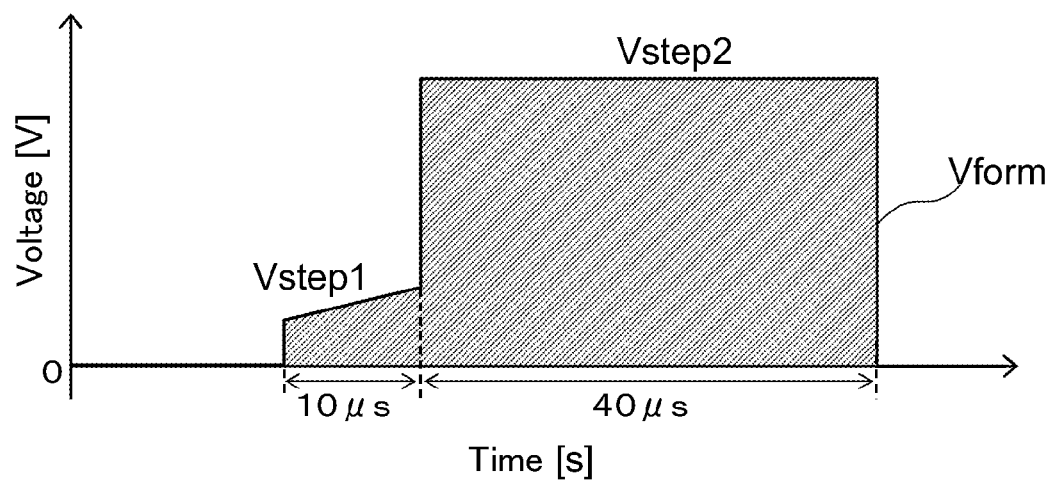
FIG. 9 is another example showing a voltage waveform of a forming voltage pulse applied to the variable resistive element selected as the forming process target in the present invention.

Therefore, for the above reason, according to the method of the present invention, the first pulse in the first step may be a pulse whose voltage amplitude gradually rises within the range where the voltage amplitude is below the threshold voltage at which the forming is caused. FIG. 9 shows one example of the first pulse whose voltage amplitude gradually rises. In addition, the first voltage in the first step and the second voltage in the second step are to be continuously applied by connecting an end of the first pulse to a start of the second pulse.

In addition, according to this embodiment, the application time of the first pulse in the first step is set to 10 μs, but when the same evaluation is made for the case where the application time of the first pulse is further reduced, it is found that the effect of reducing the current flowing at the time of the reset action is obtained until about 1 μs. In addition, the application time of the second pulse in the second step is set to 40 μs in comparison with the conventional pulse forming, but the time is not limited to this value as long as the application time is longer than a time required to perform the forming process for the variable resistive element.

In addition, the applied voltage amplitude of the first pulse in the first step is set to 1 V in this embodiment, but it is considered that this value is changed depending on various changes of the situation. Because, the applied voltage amplitude of the first pulse in the first step needs to be lower than the voltage at which the resistance of the variable resistive element 2 is lowered, that is, needs to be lower than a breakdown voltage of the variable resistive element 2, but the voltage causing the breakdown strongly depends on the variable resistor material, the electrode material, and the variable resistive element structure such as a film thickness.

In addition, it is considered that the method of the present invention is effective for the variable resistive element in which the filament path needs to be formed by the forming process, and as the variable resistor 3, other than the hafnium oxide (HfOx) in this embodiment, the same effect can be obtained with respect to n-type metal oxides such as titanium oxide (TiOx), tantalum oxide (TaOx), and zirconium oxide (ZrOx).

In addition, as the variable resistor 3, as for a p-type metal oxide, similar to the n-type metal oxide, it is considered that the generation and extinction of the oxygen loss or field migration in the filament path in the metal oxide formed by the forming process is the mechanism of the resistance switching, so that the writing current can be reduced by the method of the present invention. In this case, the p-type metal oxide which can be used for the variable resistor 3 includes a metal oxide selected from Cu, Co, and Ni.

Second Embodiment

Figure 10:
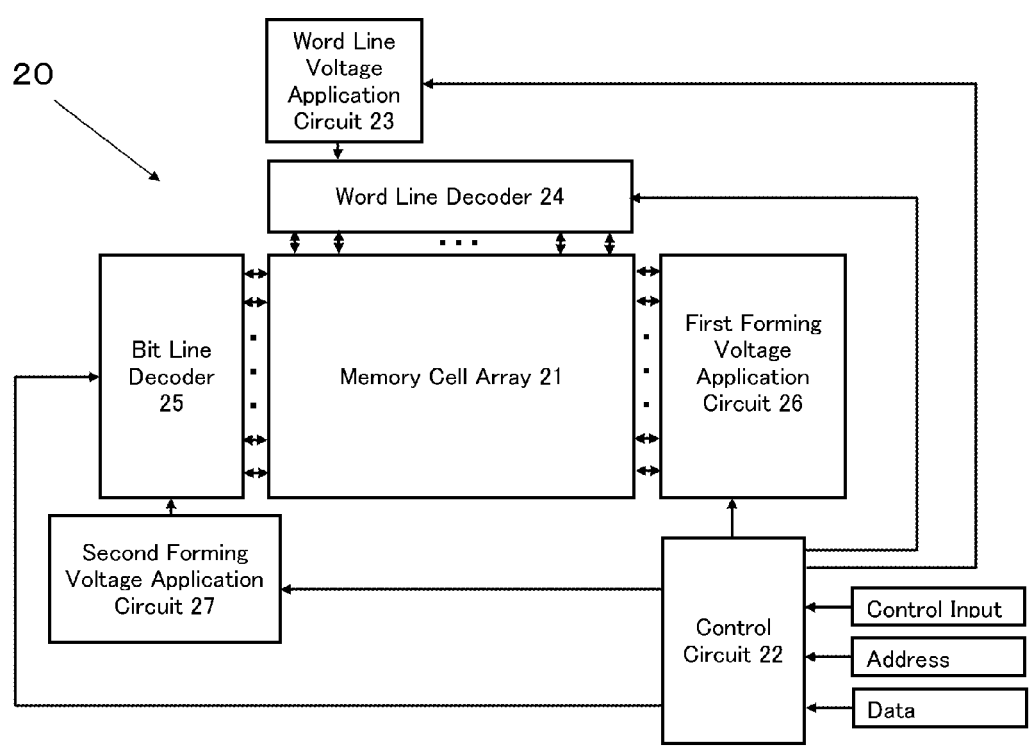
FIG. 10 is a circuit block diagram showing a configuration example of a non-volatile semiconductor memory device according to one embodiment of the present invention.

FIG. 10 shows an example of a non-volatile semiconductor memory device which can implement the method of the forming process shown in the first embodiment. FIG. 10 is a circuit block diagram showing a configuration example of a non-volatile semiconductor memory device (device of the present invention) 20 according to one embodiment of the present invention, and the non-volatile semiconductor memory device 20 includes a memory cell array 21, a control circuit 22, a word line voltage application circuit 23, a word line decoder 24, a bit line decoder 25, a first forming voltage application circuit 26, and a second forming voltage application circuit 27.

Figure 11:
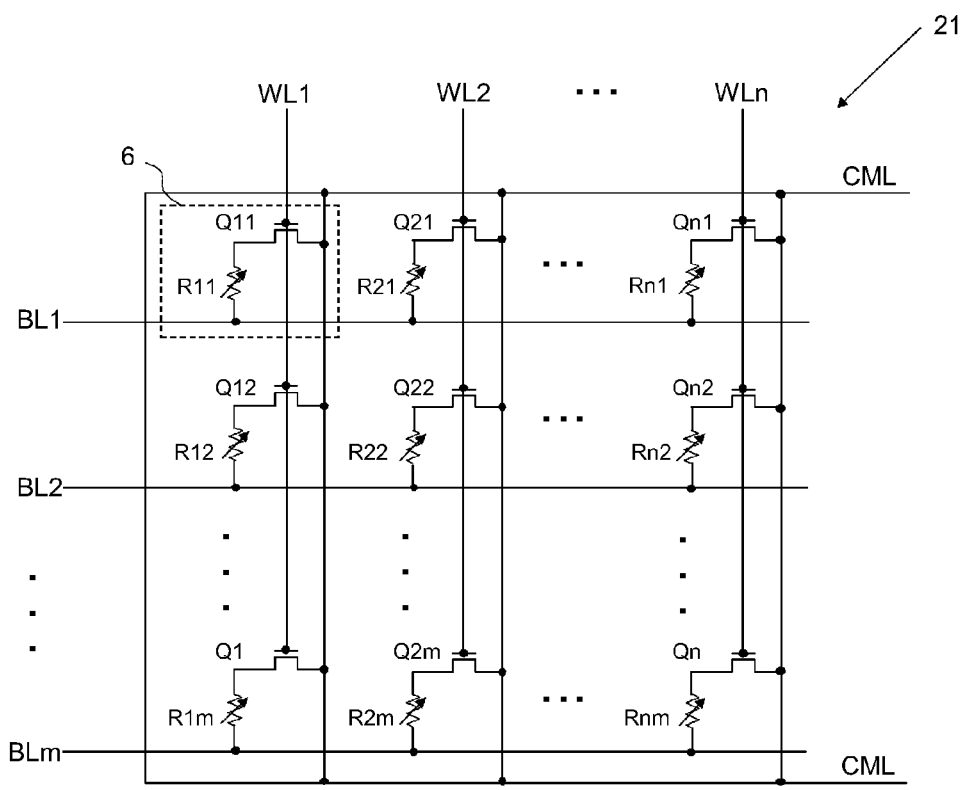
FIG. 11 is a circuit diagram showing one example of a circuit configuration of a memory cell array of the non-volatile semiconductor memory device.

FIG. 11 shows one example of a circuit configuration of the memory cell array 21. Here, the memory cell array 21 is provided by arranging the memory cells 6 in the shape of a matrix in row and column directions. Here, the memory cell 6 has the configuration shown in FIG. 2, and the 1T1R structure having the variable resistive element 2 and the transistor 7 can be used as it is. In addition, the transistor 7 shown in FIG. 2 is connected to limit the current in the first embodiment, and this is the same in this embodiment, while the transistor 7 can function as a selection transistor in this embodiment.

As described above, the variable resistive element 2 is in the initial high resistance state just after produced, but after it is changed to the variable resistance state by the forming process, the resistance state can be switched between two or more different resistance states by applying the electric stress between the first electrode 4 and the second electrode 5 in the variable resistance state. In addition, in this variable resistance state, the resistance state after switched can be held in a non-volatile manner as long as an electric stress more than the predetermined threshold value is applied, so that this resistance state can be used for storing information.

In FIG. 11, R11 to Rnm correspond to the variable resistive elements 2 in the first embodiment, and Q11 to Qnm correspond to the transistors 7 in the first embodiment, and one end of the variable resistive element 2 (R11 to Rnm) is connected to one end of a pair of input and output terminals of the transistor 7 (Q11 to Qnm), whereby the memory cell 6 is configured.

In the memory cell array 21, the gate terminals of the transistors 7 (Q11 to Qnm) of the memory cells 6 arranged in the same row are connected to each other by word lines WL1 to WLn extending in the row direction (vertical direction in FIG. 11), and the other ends which are not connected to the transistors, of the variable resistive elements 2 (R11 to Rnm) of the memory cells 6 arranged in the same column are connected to each other by bit lines BL1 to BLm extending in the column direction (lateral direction in FIG. 11). Meanwhile, the other ends which are not connected to the variable resistive element, of the pair of the input and output terminals of the transistors 7 (Q11 to Qnm) of the memory cells 6 are connected to different lines extending in the row direction with respect to each memory cell 6, and the lines are short-circuited to configure one common line CML. Therefore, it is said that all the memory cells 6 are connected to the one common line CML. In addition, according to this embodiment, the number of the word lines is n, and the number of the bit lines is m, so that n×m memory cells are formed. Each of the word lines WL1 to WLn is connected to the word line decoder 24, and each of the bit lines BL1 to BLm is connected to the bit line decoder 25.

The control circuit 22 controls each memory action of the set, reset, and read, and the forming process in the memory cell array 21. More specifically, the control circuit 22 controls the word line decoder 24 and the bit line decoder 25, based on an address signal inputted from an address line, a data input inputted from a data line, and a control input signal inputted from a control signal line, and controls the memory action and the forming process of the memory cell 6. Furthermore, the control circuit 22 controls the first forming voltage application circuit 26 and the second forming voltage application circuit 27 at the time of the forming process as will be described below so that the first and second pulses are applied to the memory cell 6 selected as a forming process target. In addition, according to the example shown in FIG. 9, the control circuit 22 functions as general circuits such as an address buffer circuit, a data input/output buffer circuit, and a control input buffer circuit though they are not shown.

The word line voltage application circuit 23 generates a selected word line voltage and an unselected word line voltage required to select the memory cell serving as an action target and supplies them to the word line decoder 24 at the time of each memory action of the set, reset, and read, other than the case of the forming process of the memory cell 6.

When the memory cell of the action target is inputted to the address line and designated, the word line decoder 24 selects the word line corresponding to the address signal inputted to the address line and applies the selected word line voltage and the unselected word line voltage supplied from the word line voltage application circuit 23 to a selected word line and an unselected word line, respectively, at the time of each memory action of the set, reset, and read, other than the case of the forming process of the memory cell 6.

When the memory cell of the action target is inputted to the address line and designated, the bit line decoder 25 selects the bit line corresponding to the address signal inputted to the address line and applies a selected bit line voltage and an unselected bit line voltage supplied from a bit line voltage application circuit (not shown) to a selected bit line and an unselected bit line, respectively, at the time of each memory action of the set, reset, and read, other than the case of the forming process of the memory cell 6.

At the time of the forming process of the memory cells 6, the first forming voltage application circuit 26 is provided to previously supply a voltage within the range where the resistance of the variable resistive element 2 is not lowered, to all the memory cells 6 of the forming process target connected to the selected word line. The first pulse voltage is applied in the first step of the method of the present invention by the function of this circuit.

At the time of the forming process of the memory cell 6, the second forming voltage application circuit 27 generates the voltage required for performing the forming process for the memory cell of the forming process target and not lower than the threshold value at which the resistance of the variable resistive element 2 is lowered, and supplies the voltage to the selected memory cell of the forming process target through the bit line decoder 25 and the selected bit line. Thus, the second pulse voltage is applied in the second step of the method of the present invention.

In addition, the device 20 of the present invention is provided with a readout circuit (not shown) to determine the resistance state of the variable resistive element 2 of the memory cell 6 selected in the reading action, and the bit line voltage application circuit (not shown) to generate the voltage required for each memory action of the set, reset, and read, and supply the voltage to the selected memory cell of the memory action target through the bit line decoder 25 and the selected bit line. In addition, the above action of the bit line voltage application circuit can be performed together with the above-described second forming voltage application circuit 27.

Figure 12:
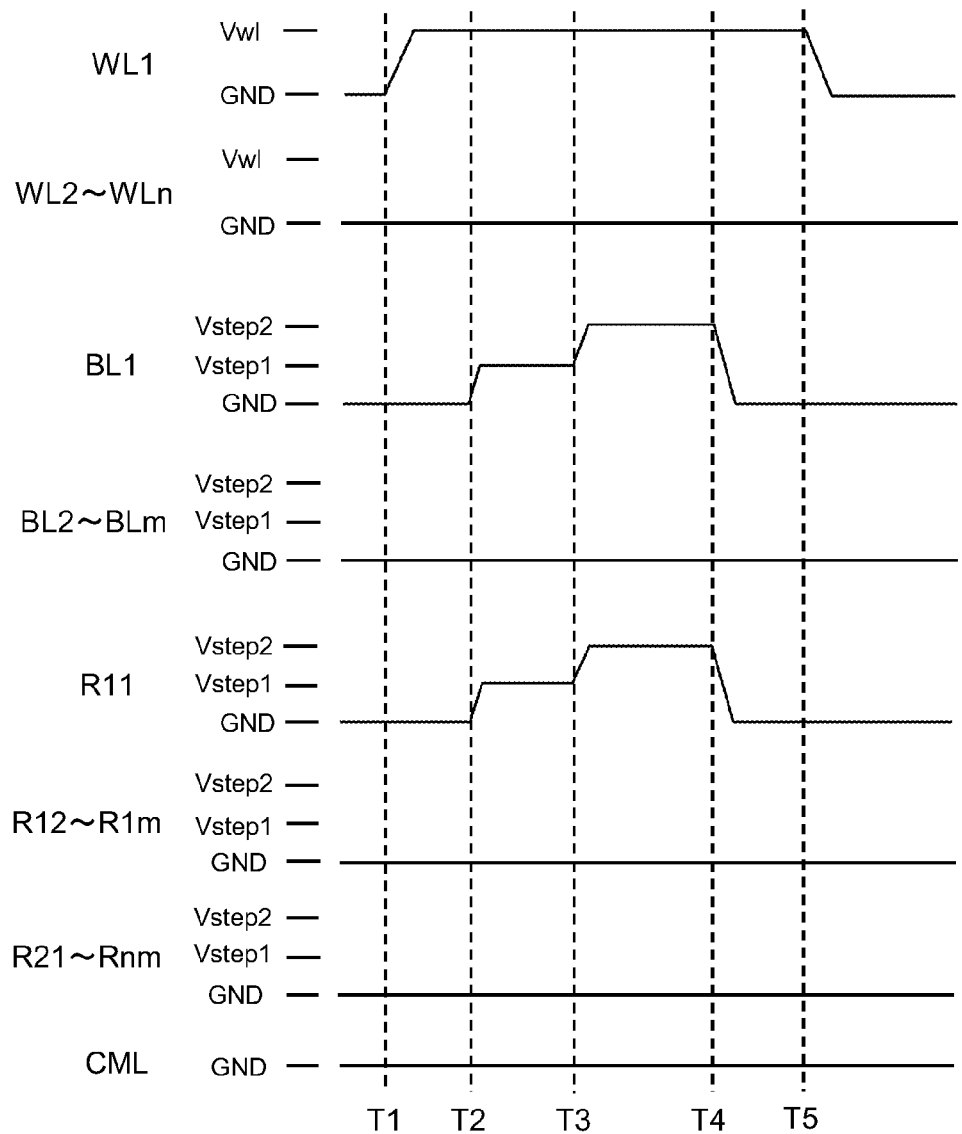
FIG. 12 is a timing chart to describe an action when the forming process of the present invention is performed for the memory cell array of the non-volatile semiconductor memory device.

Hereinafter, in the device 20 of the present invention, a description will be given of an action to implement the method of the forming process of the present invention. FIG. 12 is a timing chart showing a voltage application state of each part when the method of the forming process of the present invention is performed by the device 20 of the present invention.

Here, a description will be given of a case where the forming process is performed for the variable resistive element R11 in FIG. 11. First, at a time T1, the word line WL1 is selected by the word line decoder 24, and a selected word line voltage Vw1 is applied to the word line WL1. Thus, the selection transistors (Q11 to Q1$m$) connected to the selected word line WL1 are all turned on. On the other hand, since the voltage is not applied to the unselected word lines WL2 to WL$n$ (fixed to the GND), the selection transistors (Q21 to Q$nm$) on the unselected word lines are all in off state.

Then, at a time T2, the first voltage Vstep1 (here, 1 V) is applied to the selected bit line BL1 through the first forming voltage application circuit 26. Here, the Vstep1 is set to the voltage within the range where the resistance of the variable resistive element is not lowered. Since the common line CML is always fixed to the ground, the Vstep1 is applied to the variable resistive element R11 selected as the forming process target, and the voltage is not applied to the other variable resistive elements R12 to R1$m$, and R21 to R$nm$.

Then, at a time T3 after a predetermined period (10 μs) has elapsed from the time T2, the application of the first voltage Vstep1 to the selected bit line BL1 is stopped, and the second voltage Vstep2 to perform the forming process for the variable resistive element is applied from the second forming voltage application circuit 27 to the selected bit line BL1 through the bit line decoder 25. The Vstep2 is set to be not lower than the threshold voltage at which the resistance of the variable resistive element is lowered and the forming is caused, so that the forming process is performed for the selected variable resistive element R11. The voltage is not applied to the other variable resistive elements R12 to R1$m$, and R21 to R$nm$. Therefore, the forming process is performed only for the variable resistive element R11.

Thus, after the voltage application time required to perform the forming process of the variable resistive element R11 has elapsed (here, 40 μs), the application of the second voltage Vstep2 to the selected bit line BL1 is stopped at a time T4, and the voltage application to the selected word line is stopped at a time 5, whereby the forming process for the variable resistive element R11 is completed.

By controlling the forming process action of the device 20 of the present invention as described above, the first pulse of 1 V and 10 μs is applied to the variable resistive element 2 of the forming process target from the times T2 to T3, and the second pulse of 5 V and 40 μs is applied thereto from the times T3 and T4. Thus, the writing current at the time of the switching action can be suppressed to about the same level as the writing current attained by the DC forming process, so that the device 20 of the present invention can stably perform the switching action at the small writing current.

In addition, the forming process is performed for all the memory cells in the circuit in general. In this case, the above sequence may be executed the number of times corresponding to the number of the memory cells, but at that time, a redundant step may be appropriately changed. For example, at the time T4, when the application of the second voltage Vstep2 through the bit line BL1 is stopped, the other bit line BL2 may be selected at the same time to start applying the first voltage Vstep1 and the second voltage Vstep2 through the bit line BL2, so that the forming process of the variable resistive element R12 can be continuously performed after the completion of the forming process for the variable resistive element R11. In this case, the voltage Vw1 may be continuously applied to the selected word line WL1 until the forming processes for all the memory cells connected to the selected word line WL1 are completed. In addition, the first voltage Vstep1 may be continuously applied to all the bit lines BL1 to BL$m$ while the forming process is performed.

Figure 13:
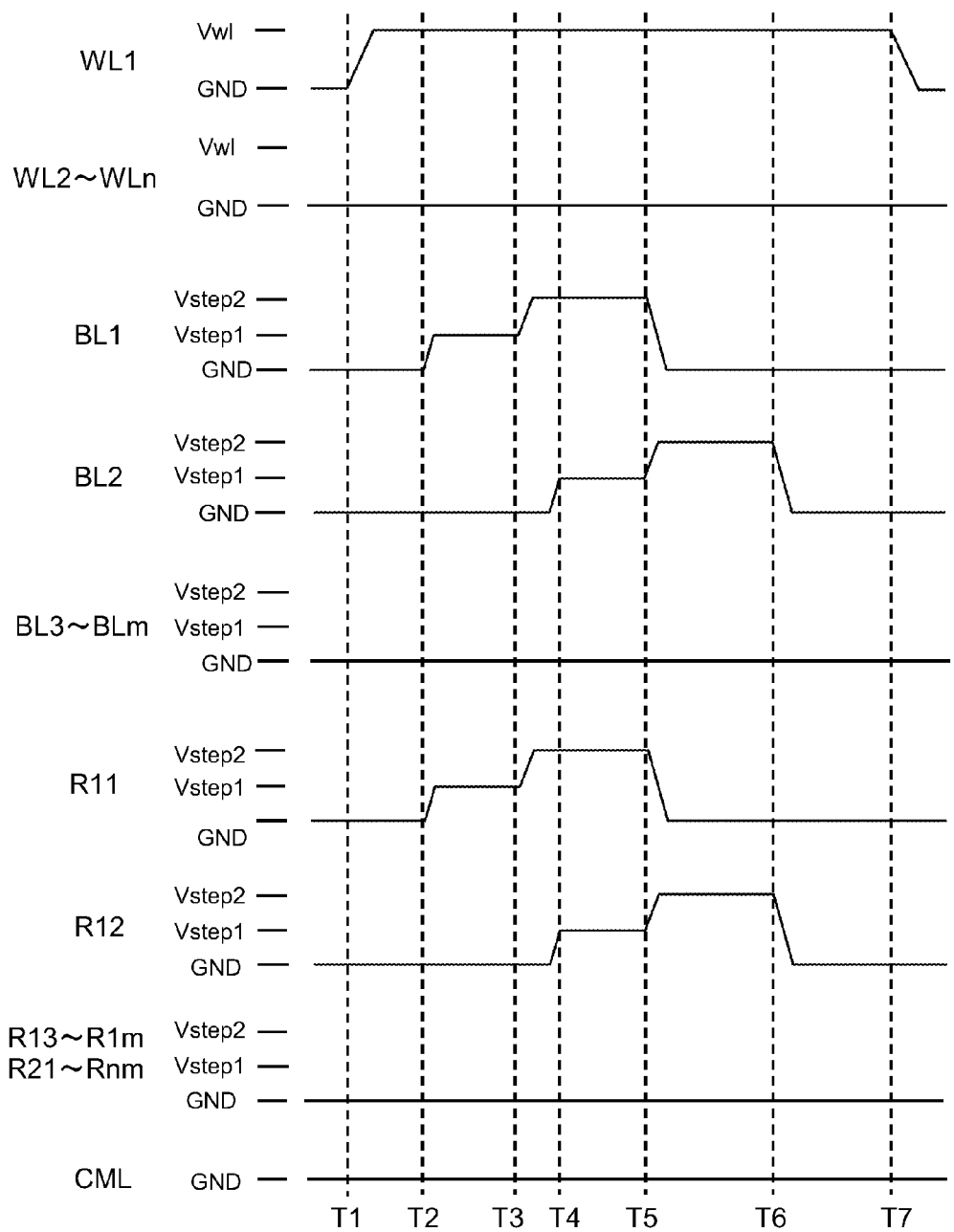
FIG. 13 is a timing chart to describe an action when the forming process of the present invention is performed for the memory cell array of the non-volatile semiconductor memory device.

A timing chart shown in FIG. 13 shows a case where the forming process is performed for the variable resistive elements R11 and R12 shown in FIG. 11, in which at the time T2, the first voltage Vstep1 is applied to the selected bit line BL1 through the first forming voltage application circuit 26, and at the time T3, the second voltage Vstep2 is applied to the selected bit line BL1 through the second forming voltage application circuit 27. Then, while the Vstep2 is applied to the variable resistive element R11, at the time T4, the first voltage Vstep1 is applied to the selected bit line BL2 through the first forming voltage application circuit 26.

Thus, the forming process for the variable resistive element R12 can be performed in parallel with the forming process for the variable resistive element R11, so that a time required for the whole forming process can be reduced.

Figure 14:
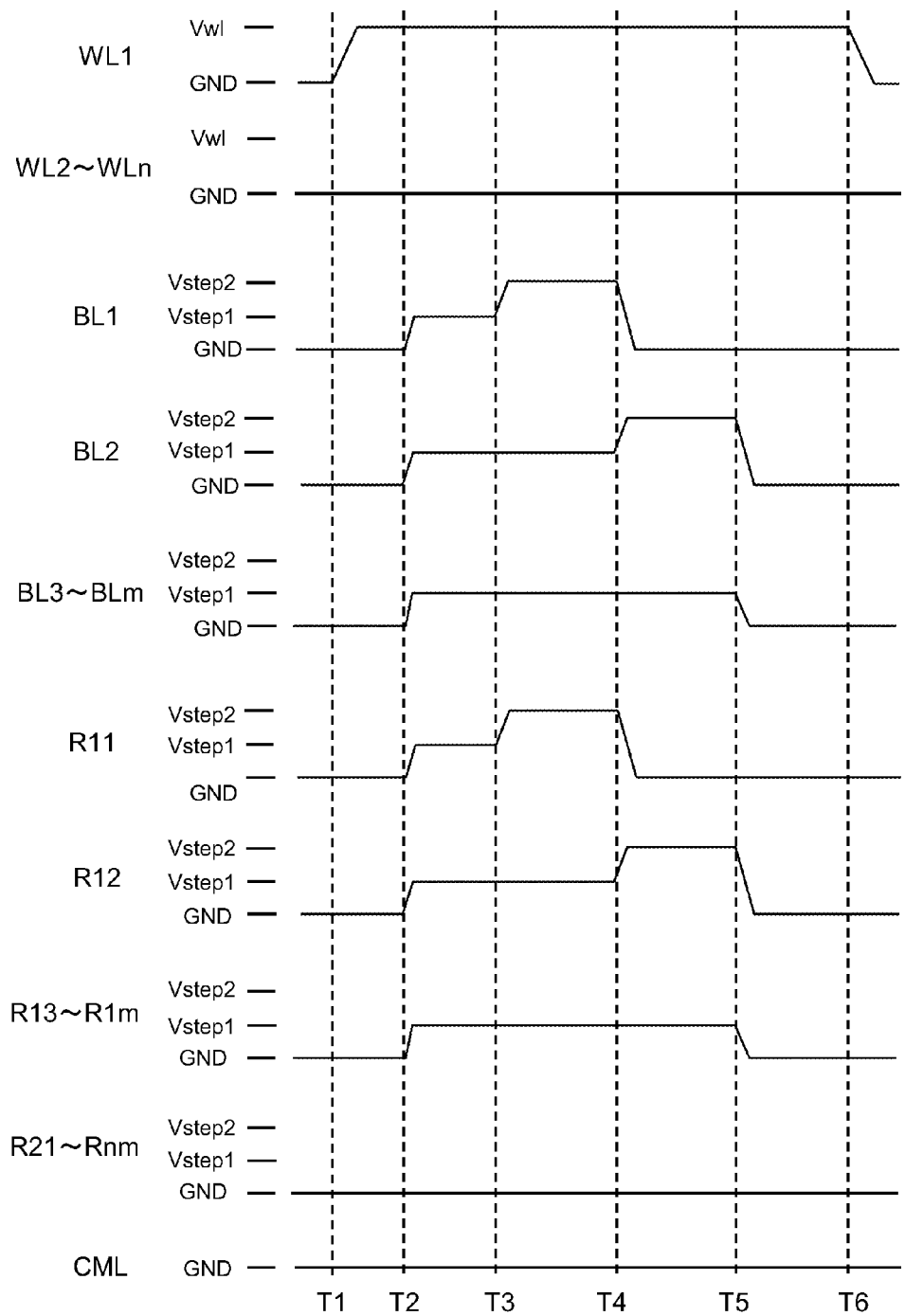
FIG. 14 is a timing chart to describe an action when the forming process of the present invention is performed for the memory cell array of the non-volatile semiconductor memory device.

Furthermore, according to a timing chart shown in FIG. 14, in the case where the forming process is performed for the variable resistive elements R11 and R12 shown in FIG. 11, at the time T2, the first voltage Vstep1 is previously applied to the all memory cells of the forming process target connected to the selected word line through the first forming voltage application circuit 26, and the second voltage Vstep2 is applied to the selected bit line BL1 from the times T3 to T4, and to the selected bit line BL2 from the times T4 to T5, through the second forming voltage application circuit 27.

Thus, the time required for the whole forming process can be reduced, and since it is not necessary to switch the application of the first voltage Vstep1 among the bit lines BL1 to BL$m$, the forming process of the present invention can be performed with simpler control.

Other Embodiments

Hereinafter, other embodiments of the present invention will be described.

(1) According to the second embodiment, the common line CML is in common with all the memory cells in the memory cell array 21. In other words, the common line CML extends in both row and column directions. However, the present invention is not limited to this arrangement of the common line. Common lines CML1 to CML$n$ may extend in parallel to the bit line in the column direction, or the common lines CML1 to CML$m$ may extend in a direction perpendicular to the bit line in the row direction (that is, in parallel to the word line).

(2) According to the second embodiment, the first forming voltage application circuit 26 applies the first pulse of 1 V and 10 μs to the memory cell selected as the forming process target from the side of the bit line, and then the second forming voltage application circuit 27 applies the second pulse of 5 V and 40 μs thereto from the side of the bit line, to perform the forming process. However, the present invention is not limited to this, and the first pulse or the second pulse may be applied from the side of the common line. In this case, the configuration in which the common line CML extends in the row or column direction is preferable compared to the configuration in which the common line CML extends in both row and column directions in the memory cell array 21.

That is, the voltage applied to between both electrodes of the variable resistive element of the forming process target only has to be lower than the threshold voltage at which the resistance of the variable resistive element is lowered in the first step to apply the first pulse, and to be not lower than the threshold voltage at which the resistance of the variable resistive element is lowered in the second step to apply the second pulse, and when the forming voltage application circuit (the first forming voltage application circuit 26 and the second forming voltage application circuit 27) applies the voltage across the memory cell of the forming process target so as to satisfy the above condition, the forming process according to the present invention can be implemented.

The present invention can be applied to the non-volatile semiconductor memory device provided with the variable resistive element, and particularly, applied to the variable resistive element in which the filament path is formed by the voltage application, and the resistance state is reversibly changed due to generation and extinguish of the filament path.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A method of a forming process for a variable resistive element provided with a variable resistor formed of a metal oxide, and a first electrode and a second electrode sandwiching the variable resistor, wherein
   a resistance state between the first and second electrodes in the variable resistive element is lowered by the forming process, so that the variable resistive element is changed from an initial high resistance state to a variable resistance state in which the resistance state is switched between two or more different resistance states by an applied voltage,
   the variable resistive element in the variable resistance state is allowed to hold the resistance state in a non-volatile manner, and
   the forming process comprises:
   a first step of applying a first pulse having a voltage amplitude set to be lower than a threshold voltage at which the resistance of the variable resistive element is lowered, to between the first and second electrodes of the variable resistive element; and
   a second step of applying a second pulse having a voltage amplitude having the same polarity as that of the first pulse and set to be not lower than the threshold voltage, to between the first and second electrodes of the variable resistive element after the first step.

2. The method of the forming process according to claim 1, wherein
   application of the first pulse in the first step, and application of the second pulse in the second step are continuously performed by connecting an end of the first pulse to a start of the second pulse.

3. The method of the forming process according to claim 1, wherein
   the first pulse has a gradually increasing voltage amplitude.

4. The method of the forming process according to claim 1, wherein
   the variable resistor comprises a metal oxide showing n-type conductivity.

5. The method of the forming process according to claim 4, wherein
   the variable resistor comprises a metal oxide selected from Ti, Ta, Hf, and Zr.

6. The method of the forming process according to claim 1, wherein
   a work function of the first electrode is 4.5 eV or less, and a work function of the second electrode is 4.5 eV or more.

7. A non-volatile semiconductor memory device having a memory cell, the memory cell including a variable resistive element and a selection transistor, wherein
   the variable resistive element is provided with a variable resistor comprising a metal oxide, and a first electrode and a second electrode sandwiching the variable resistor,
   the selection transistor is provided with a control terminal and a pair of input and output terminals,
   a resistance state between the first and second electrodes of the variable resistive element is lowered by a forming process, so that the variable resistive element is changed from an initial high resistance state before the forming process to a variable resistance state, the resistance state is switched between two or more resistance states by an electric stress applied to between the first and second electrodes of the variable resistive element in the variable resistance state, and one switched resistance state is used for storing information,
   one of the first electrode and the second electrode of the variable resistive element is connected to one end of the pair of the input and output terminals of the selection transistor to constitute the memory cell, and the device comprises:
   a memory cell array provided by arranging the memory cells in a shape of a matrix in row and column directions;
   a word line extending in the row direction for connecting the control terminals of the selection transistors of the memory cells arranged in the same row;
   a bit line extending in the column direction for connecting the other ones of the first electrodes and the second electrodes of the variable resistive elements of the memory cells arranged in the same column;
   a common line extending in the row or column direction for connecting the other ends of the pair of the input and output terminals of the selection transistors of the memory cells;
   a word line voltage application circuit for applying a voltage to the word line connected to the memory cell selected as a forming process target;
   a forming voltage application circuit for applying a voltage required for the forming process, across the memory cell selected as the forming process target, through the bit line and the common line connected to the selected memory cell; and
   a control circuit for controlling the forming voltage application circuit in such a manner that a first pulse set to be lower than a threshold voltage at which the resistance of the variable resistive element is lowered, is applied to between the first and second electrodes of the variable resistive element selected as the forming process target, and then continuously a second pulse having the same polarity as that of the first pulse and set to be not lower than the threshold voltage is applied to between the first and second electrodes of the variable resistive element.

8. The non-volatile semiconductor memory device according to claim 7, wherein
the forming voltage application circuit applies the second pulse to one variable resistive element, and simultaneously applies the first pulse to at least one other variable resistive element in which the forming process is not yet completed, among the variable resistive elements selected as the forming process target.

9. The non-volatile semiconductor memory device according to claim 8, wherein
the forming voltage application circuit applies the second pulse to one variable resistive element, and simultaneously applies the first pulse previously to all the other variable resistive elements in which the forming process is not yet completed, among the variable resistive elements selected as the forming process target.

10. The non-volatile semiconductor memory device according to claim 7, wherein
the first pulse has a gradually increasing voltage amplitude.

11. The non-volatile semiconductor memory device according to claim 7, wherein
the variable resistor comprises a metal oxide showing n-type conductivity.

12. The non-volatile semiconductor memory device according to claim 11, wherein
the variable resistor comprises a metal oxide selected from Ti, Ta, Hf, and Zr.

13. The non-volatile semiconductor memory device according to claim 7, wherein
a work function of the first electrode is 4.5 eV or less, and a work function of the second electrode is 4.5 eV or more.

* * * * *